SHUNT-TYPE COAXIAL TO WAVEGUIDE HARMONIC GENERATOR

Filed Feb. 15, 1965

INVENTORS.
EDWARD A. MURPHY
WILLIAM POSNER
BY
R. J. Frank
ATTORNEY

United States Patent Office 3,353,087
Patented Nov. 14, 1967

3,353,087

SHUNT-TYPE COAXIAL TO WAVEGUIDE HARMONIC GENERATOR

Edward A. Murphy, Farmingdale, and William Posner, Brooklyn, N.Y., assignors to General Telephone and Electronics Laboratories Inc., a corporation of Delaware Filed Feb. 15, 1965, Ser. No. 432,602
6 Claims. (Cl. 321—69)

ABSTRACT OF THE DISCLOSURE

A harmonic generator is described in which a varactor diode is shunt mounted in a section of coaxial line which is terminated at one end in a short circuit and coupled at the other end to a waveguide. The varactor is mounted less than one-fourth of a wavelength from the short so that the coaxial line may be made series resonant at the input frequency. The length of the coaxial line establishes an antiresonant trap at the harmonic frequency.

This invention relates to a harmonic generator, and more particularly to a harmonic generator employing a nonlinear impedance element and having a coaxial input section and a waveguide output section.

The generation of radio frequency signals in the microwave region has given rise to an increasing interest in solid state harmonic generators. These harmonic generators allow the use of a driving frequency low enough to obtain reasonable amounts of power while also permitting the use of a crystal oscillator to maintain the accuracy of the driving frequency.

These generators employ generally a nonlinear impedance, such as a junction diode or varactor, which produces many harmonic signals when driven by a fundamental frequency signal. The varactor is a reverse-biased semiconductor diode in which the junction capacitance is a function of the voltage thereacross. Varying this voltage rapidly by the use of a high frequency energy source, enables the varactor to efficiently generate significant amounts of harmonic power at frequencies which are multiples of the driving frequency.

The power handling capability of a varactor diode is determined primarily by the amount of heat that it can dissipate during normal operation. Since the power contained in the lowest-order harmonic is substantially greater than that existing at higher order harmonics, it has been found more efficient to utilize the second harmonic as the output signal. Therefore, harmonic generators are normally operated as frequency doublers connected in tandem with the output of the preceding one appearing as the input to the next succeeding generator.

Two general circuit configurations have been used to generate harmonics. One configuration, referred to as the series-type circuit, employs a varactor diode connected in series between the input and output circuits. A shunt filter is connected in each circuit to prevent the unwanted harmonic signals generated from entering the external circuits. In this configuration, the varactor generates an entire spectrum of harmonic frequencies with all but the desired harmonic flowing through the shunt filters. In addition, the series connection of the diode has been found not to provide the degree of heat dissipation normally required in high power harmonic generation.

The second circuit configuration, known as the shunt-type circuit, uses a varactor diode which is connected in shunt between the input and output circuits. In this type of circuit, the input and output filters are connected in series with the varactor coupled to the connecting point of the filters. The series connection of the input and output filters suppresses the generation of unwanted harmonic signals. Thus the diode is used to generate substantially only the desired frequency harmonic and the efficiency is found to be normally higher than that of the series type circuit wherein the undesired harmonics are suppressed after generation. Also, the shunt connection enables one end of the varactor diode to be connected to ground which in turn provides the required heat dissipation.

In the operation of a harmonic generator, it is desirable for the fundamental and second harmonic frequencies to be confined to the input and output circuits respectively. The frequency separation may be readily performed at low frequencies by providing frequency traps or appropriate filters in the input and output circuits. However at microwave frequencies, i.e. frequencies in the hundreds of megacycles per second and above range, it has been found difficult to incorporate effective frequency traps in the circuits. This difficulty arises from the fact that at these high frequencies, distributed-element circuits rather than lumped-element circuits must be employed. As a result, the suppression of unwanted signals has generally resulted in the use of filters connected externally of the harmonic generator. By using external filtering, a portion of the fundamental current is found to flow in the output circuit and vice versa, which reduces the efficiency of the harmonic generator.

In addition, within the approximate frequency range of 3000 mc. to 12,000 mc. per second, a transition between different types of distributed-element circuits is generally required. The need for a transition arises from the fact that as the frequency increases, the dimensions of the coaxial transmission line must be correspondingly decreased to prevent the establishment of unwanted higher order modes. Further, the attenuation in a coaxial transmission line increases with increasing frequency due primarily to dielectric losses. Thus, a transition from coaxial transmission line to waveguide is found desirable for high power, high efficiency operation in the above approximate range.

Accordingly, an object of the present invention is the provision of a shunt-type coaxial to waveguide harmonic generator.

Another object is to provide a coaxial to waveguide harmonic generator wherein the need for external filtering is obviated.

Another object is to provide a coaxial to waveguide harmonic generator having an improved efficiency.

A further object is to provide a coaxial to waveguide harmonic generator of reduced circuit complexity.

Yet another object is to provide a coaxial to waveguide harmonic generator having increased power-handling capability.

In accordance with the present invention, a coaxial to waveguide harmonic generator is constructed comprising a coaxial assembly having inner and outer conductors. The assembly is terminated at one end in a short circuit and coupled at the other end to a section of waveguide. A nonlinear impedance, such as a varactor diode is mounted in shunt between the inner and outer conductors of the coaxial assembly and is common to both the input and output circuits.

The portion of the coaxial assembly between the nonlinear impedance and the short circuited end, hereinafter termed the input section, is formed to have an electrical length of less than one-fourth of a wavelength at the input frequency. Thus, the input section appears as an inductive reactance at the input frequency. In addition, the center conductor in the input section is broken to provide a variable gap-capacitor which is in series with the capacitance of the varactor. By varying this gap capacitance, the combination of the input section and the varactor and gap capacitances can be made series resonant at the input frequency so that the impedance to the input signal is quite low.

Since the input section is less than one-fourth of a wavelength at the input frequency, it appears twice as long or less than one-half of a wavelength at the second harmonic frequency. And, for input sections having an electrical length of about one-eighth of a wavelength at the input frequency, the impedance presented by the input section to the second harmonic signal at the varactor diode is quite high and the second harmonic signal is suppressed without requiring the use of filters connected externally of the input circuit. This result is obtained when the input section is selected to be about one-eighth of a wavelength at the input frequency due to the fact that the input section appears as a substantially open circuit at the diode at the second harmonic frequency to provide an anti-resonant trap for the second harmonic signal. Thus the input section can be tuned to series resonance at the input frequency while serving as an anti-resonant trap at the second harmonic frequency.

The open end of the coaxial assembly is coupled to the wall of a waveguide with the center conductor forming a probe extending into the waveguide to enable the power to flow therebetween. Suitable tuning means, such as a sliding short circuit or multistub screw tuner, are provided to match the impedance of the waveguide to that of the coaxial assembly and to neutralize the reactance associated with the probe.

The dimensions of the waveguide are selected so that the cut-off frequency of the waveguide, i.e. the frequency below which power can not propagate in the waveguide, resides between the fundamental or input signal frequency and the second harmonic frequency. Thus, the input signal is separated from the second harmonic signal propagating in the waveguide by utilizing the high pass filter characteristic of the waveguide.

The shunt-type construction of this harmonic generator enables high capacitance varactor diodes to be used and therefore provides an increase in the power handling capability of the generator. To this end, the input resonant circuit is a low inductive reactance circuit, since at one-eighth of a wavelength the reactance is equivalent to the relatively low characteristic impedance of the coaxial assembly, and consequently the capacitive reactance required for series resonance is low. The capacitive reactance is an inverse function of capacitor size at a given frequency and thus lowering it enables a higher capacitance diode to be used. In addition, high capacitance diodes have large junction areas and increased power dissipation ratings. Thus at a given power level, the high capacitance diodes are found to operate cooler than low capacitance diodes. Since the series resistance of a varactor diode increases with increased temperature, the efficiency of the harmonic generator is improved when the diode operates at a relatively low temperature.

Further features and advantages of the invention will become more readily apparent from the following description of a specific embodiment of the invention when viewed in conjunction with the accompanying drawings, in which.

Figure 1:
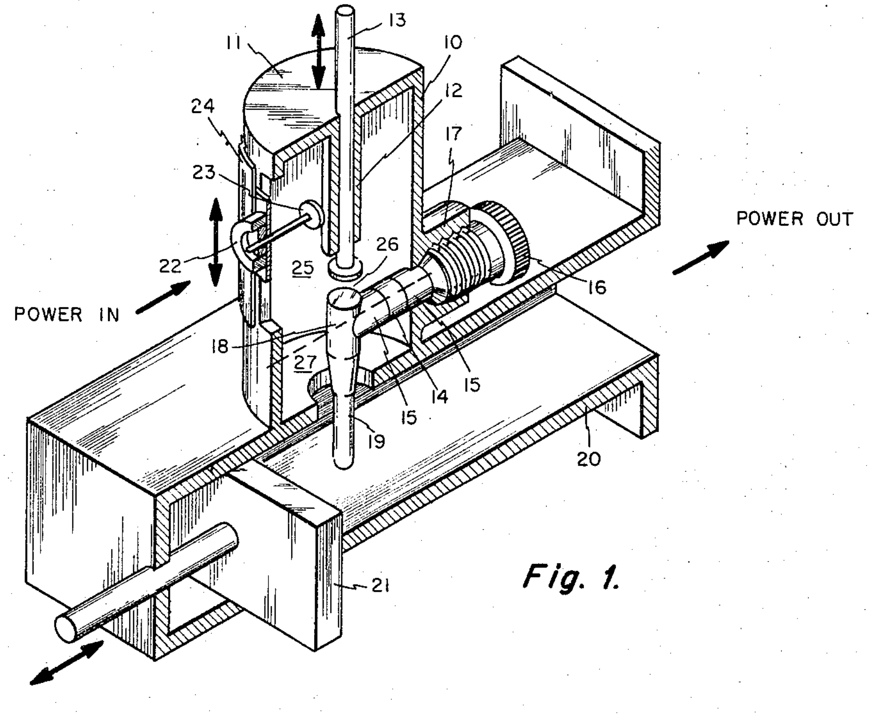
FIG. 1 is a side view in section of one embodiment of the invention.

Referring more particularly to FIG. 1 there is shown a harmonic generator comprising a coaxial assembly 10 having one end terminated by short-circuiting end wall 11. End wall 11 has a centrally located opening therein about which hollow inner or center conductor 12 is affixed. Extending through the opening in conductor 12 is adjustable conductor 13. Thus varying the depth of insertion of conductor 13 adjusts the length of the first segment of the center conductor of the coaxial assembly.

A nonlinear reactance element 14, for example a varactor diode mounted in a conventional package 15, is positioned within coaxial assembly 10 by screw member 16 and corresponding threaded fixture 17. At the outer end of diode package 15, a second segment 18 of the center conductor and an aligned coupling probe 19 are affixed. As shown, first and second segments 12 and 18 are in alignment to form an inner coductor having a gap therein. This configuration places the varactor diode in shunt with one end thereof contacting the outer wall of the coaxial assembly to insure a high degree of heat dissipation.

The open end of coaxial assembly 10 is mated to an opening in the broad wall of waveguide section 20 such that coupling probe 19 extends substantially midway therein. The waveguide section is provided with sliding short circuit 21 located behind coupling probe 19 so that the waveguide impedance may be matched to the impedance of the coaxial assembly and the reactance of the coupling probe may be compensated so that power may flow between the coaxial assembly and the waveguide. If desired, other forms of waveguide tuning may be employed in place of sliding short circuit 21.

The input to coaxial assembly 10 is supplied from a conventional external coaxial connection 22 having its center conductor connected to capacitive coupling probe 23. The connection 22 is shown mounted on slide 24 and may be moved along the axis of coaxial assembly 10 until the input section or cavity 25, herein used to denote the portion of coaxial assembly 10 bounded by end wall 11 and diode 14 as shown by the broken line of FIG. 1, is matched to the input line (not shown). Also, the depth of coupling probe 23 may be made adjustable for additional tuning if desired.

Input section or cavity 25 has an electrical length of less than one-fourth of a wavelength at the input frequency and therefore exhibits an inductive reactance. For input sections having a length of about one-eighth of a wavelength, the impedance at the input frequency has a magnitude of the order of the characteristic impedance of the coaxial assembly. The input section also contains a variable gap capacitor 26 which is readily adjusted by varying the depth of insertion of conductor 13. The input section 25 includes in series, the above-mentioned inductance and the series combination of the gap and varactor diode capacitances. Adjustment of conductor 13 enables the input section 25 to be tuned to series resonance at the input frequency and provides maximum current flow through the diode.

In addition, input section 25 has an electrical length of less than one-half of a wavelength at the second harmonic frequency. If the input section is selected to have an electrical length of about one-eighth of a wavelength, the length at the second harmonic is about one-fourth of a wavelength. And, the short-circuited end wall 11 when reflected through about one-fourth of a wavelength appears substantially as an open circuit at the varactor diode. Thus, input section 25 serves as an anti-resonant trap for currents flowing at the second harmonic frequency.

The output section 27 of coaxial assembly 10 shown in FIG. 1 is bounded by the broken line and waveguide 20, contains power at both the fundamental and second harmonic frequencies. However, the dimensions of waveguide section 20 are selected such that its cut-off frequency resides between the input or fundamental and the second harmonic frequencies. Thus any power at the input frequency which may be coupled by probe 19 from output section 27 to waveguide 20 is suppressed by the inherent high-pass filtering characteristic of the waveguide and does not propagate therein.

Figure 2:
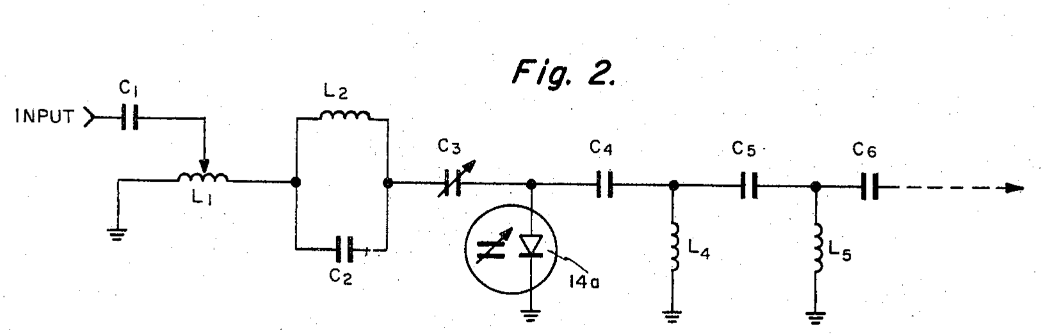
FIG. 2 is a diagram of the equivalent circuit of the embodiment of FIG. 1.

The electrical equivalent circuit for the harmonic generator is shown in FIG. 2 wherein capacitor $C_1$ represents capacitive coupling probe 23. Inductance $L_1$ corresponds to the electrical length of input section 25 at the input frequency while the parallel combination of inductance $L_2$ and capacitance $C_2$ correspond to the antiresonant trap provided by the electrical length of input section 25 at the second harmonic frequency. Gap capacitor 26 is shown as variable capacitor $C_3$.

The output section 27 and waveguide 20 are shown as the equivalent cascaded high-pass filters comprised of capacitors $C_4$, $C_5$, $C_6$ and inductances $L_4$, $L_5$. Varactor diode 14*a* is shown connected in shunt and common to both the input and output circuits.

During normal operation, coupling probe 23 is adjusted to match the generator with the input line. The capacitor $C_3$ is then varied by adjusting conductor 13 until the series combination of inductance $L_1$, capacitance $C_1$ and diode 14*a* are series resonant at the input frequency. Sliding short 21 is then adjusted for optimum second harmonic power flow between output section 27 and waveguide 20.

Figure 3:
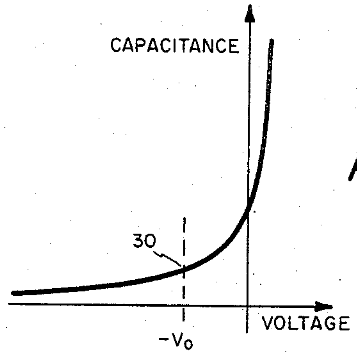
FIG. 3 is a graph showing the nonlinear characteristics of a varactor diode.

The nonlinear voltage-capacitance characteristic of the varactor diode 14*a* is shown in FIG. 3. As known in the art, a varactor is a backbiased PN junction wherein the variation of the magnitude of the backbias voltage changes the width of the depletion layer across the junction to vary the capacitance. During operation, the varactor establishes a self-bias, $-V_o$, such that its operating point is shifted from the ordinate of FIG. 3 to point 30. The self-bias of the varactor is due primarily to the discharge of gap capacitor 26 through the back resistance of the varactor during the non-conducting portion of the input signal cycle. The nonlinearity of the varactor characteristics results in the generation of harmonics, with the second harmonic being the most significant.

In one embodiment tested and operated with the electrical length of input section 25 selected to be three-sixteenths of a wavelength at the input frequency, the power input was 2.0 watts at 3000 mc. and the power output was 1.0 watt at 6000 mc.

While the above invention has been described with reference to a particular embodiment, it will be understood that many modifications may be made without departing from the spirit and scope of the invention.

What is claimed is:

1. A harmonic generator which comprises
(a) a coaxial assembly having inner and outer conductors, said assembly being terminated at one end in a short circuit,
(b) a nonlinear reactance mounted in shunt between the inner and outer conductors of said assembly, said reactance dividing the coaxial assembly into an input and an output section, said input section having an electrical length of less than one-fourth of a wavelength at the input frequency so as to exhibit a low inductive reactance at the input frequency while providing a high impedance at the second harmonic frequency,
(c) means for coupling a signal at the input frequency to said input section,
(d) first variable reactance means contained in said input section, the combination of said input section, said nonlinear reactance and said first reactance means being series resonant at the input frequency, and
(e) a section of waveguide coupled to receive power from the output section of said coaxial assembly, the cut-off frequency of said waveguide being between the input frequency and the output frequency.

2. A harmonic generator which comprises
(a) a coaxial assembly having inner and outer conductors, said assembly being terminated at one end in a short circuit,
(b) a voltage variable nonlinear reactance mounted in shunt between the inner and outer conductors of said assembly, said reactance dividing the coaxial assembly into an input and an output section, said input section having an electrical length of about one-eighth of a wavelength at the input frequency to provide a low inductive reactance at the input frequency and a substantially anti-resonant trap at the second harmonic of the input frequency,
(c) means for coupling a signal of the input frequency to said input section,
(d) first variable reactance means contained in said input section, the combination of said input section, said nonlinear reactance and said first reactance means being series resonant at the input frequency, and
(e) a section of waveguide coupled to receive power from the output section of said coaxial assembly, the cut-off frequency of said waveguide being between the input frequency and the second harmonic thereof.

3. A harmonic generator which comprises
(a) a coaxial assembly having inner and outer conductors, said assembly being terminated at one end in a short circuit,
(b) a voltage variable nonlinear reactance mounted in shunt between the inner and outer conductors of said assembly, said reactance dividing the coaxial asssembly into an input and an output section, said input section having an electrical length of about one-eighth of a wavelength at the input frequency to provide a low inductive reactance at the input frequency and a substantially antiresonant trap at the second harmonic of the input frequency,
(c) means for coupling a signal at the input frequency to said input section,
(d) first variable capacitance means contained in said input section, the combination of said input section, said nonlinear reactance and said variable capacitance means being tuned to series resonance at the input frequency,
(e) a section of waveguide coupled to the output section of said coaxial assembly, the cut-off frequency of said waveguide being between the input frequency and the second harmonic thereof, and
(f) tuning means for impedance matching said waveguide to said output section to insure the flow of power therebetween.

4. A harmonic generator which comprises
(a) a coaxial assembly having inner and outer conductors, said assembly being terminated at one end in a short circuit,
(b) a voltage variable nonlinear reactance mounted in shunt between the inner and outer conducors of said assembly, said reactance dividing the coaxial assembly into an input and an output section, said input section having an electrical length of about one-eighth of a wavelength at the input frequency to provide a low inductive reactance at the input frequency and a substantially anti-resonant trap at the second harmonic of the input frequency,
(c) means for coupling a signal at the input frequency to said input section,
(d) a variable gap capacitance contained in said input section, the combination of said input section, said nonlinear reactance and said gap capacitance being tuned to series resonance at the input frequency,
(e) a section of waveguide coupled to the output section of said coaxial assembly, the cut-off frequency of said waveguide being between the input frequency and the second harmonic thereof, and
(f) tuning means for impedance matching said waveguide to said output section to insure the flow of power therebetween.

5. A harmonic generator which comprises
(a) a coaxial assembly having inner and outer conductors and being terminated at one end in a short circuit, said inner conductor comprising first and second spaced segments to form a gap capacitance therebetween,
(b) a varactor diode mounted in shunt between the second segment of said inner conductor and said outer conductor of the assembly, said diode dividing the coaxial assembly into an input and an output section, said input section having an electrical length of about one-eighth of a wavelength at the input frequency to provide a low inductive reactance at the input frequency and a substantially antiresonant trap at the second harmonic of the input frequency, the combination of said input section, the capacitance of said varactor diode, and said gap capacitance being series resonant at the input frequency, (c) means for coupling a signal at the input frequency to said input section, (d) a section of waveguide coupled to the output section of said coaxial assembly, the cut-off frequency of said waveguide being between the input frequency and the second harmonic thereof, and (e) tuning means connected to said waveguide section for impedance matching the waveguide to said output section to insure the flow of power therebetween.

6. A harmonic generator which comprises (a) a coaxial assembly having inner and outer conductors and being terminated at one end in a short circuit, said inner conductor comprising first and second spaced segments forming a gap capacitance therebetween, the first segment having an adjustable length to permit variation of said capacitance, (b) a varactor diode mounted in shunt between the second segment of said inner conductor and said outer conductor of the assembly, said diode dividing the coaxial assembly into an input and an output section, said input section having an electrical length of about one-eighth of a wavelength at the input frequency to provide a low inductive reactance at the input frequency and a substantially anti-resonant trap at the second harmonic of the input frequency, the combination of said input section, the capacitance of said varactor diode, and said gap capacitance being tuned to series resonance at the input frequency, (c) means for coupling a signal at the input frequency to said input section, (d) a section of waveguide coupled to the output section of said coaxial assembly, the cut-off frequency of said waveguide being between the input frequency and the second harmonic thereof, (e) coupling means connected to the second segment of said inner conductor and extending into said section of waveguide for coupling power thereto, and (f) tuning means connected to said waveguide section for impedance matching the waveguide to said output section to insure the flow of power therebetween.

References Cited

UNITED STATES PATENTS

| | | | |
|---|---|---|---|
| 2,408,420 | 10/1965 | Ginzton | 321—60 |
| 3,223,918 | 12/1965 | Ludwig et al. | 321—69 |
| 3,286,156 | 11/1966 | Barkes | 321—69 |

JOHN F. COUCH, *Primary Examiner.*

G. GOLDBERG, *Assistant Examiner.*